US010137789B2

United States Patent
Xu et al.

(10) Patent No.: US 10,137,789 B2
(45) Date of Patent: Nov. 27, 2018

(54) SIGNAL PIN ARRANGEMENT FOR MULTI-DEVICE POWER MODULE

(71) Applicant: FORD GLOBAL TECHNOLOGIES, LLC, Dearborn, MI (US)

(72) Inventors: Fan Xu, Novi, MI (US); Lihua Chen, Northville, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 386 days.

(21) Appl. No.: 15/214,630

(22) Filed: Jul. 20, 2016

(65) Prior Publication Data

US 2018/0022220 A1    Jan. 25, 2018

(51) Int. Cl.
*B60L 11/18* (2006.01)
*H02M 7/5387* (2007.01)
(Continued)

(52) U.S. Cl.
CPC ......... *B60L 11/1803* (2013.01); *H02M 7/003* (2013.01); *H02M 7/5387* (2013.01);
(Continued)

(58) Field of Classification Search
CPC ............. H01L 23/495; H01L 23/49562; H01L 23/49811; H01L 23/49844; H01L 23/49861; H01L 23/498; H01L 23/53228; H01L 23/538; H01L 23/5383; H01L 23/5385; H01L 23/585; H01L 29/7428; H01L 29/66325–29/66348; H01L 29/7393–29/7398; H01L 2924/13055;
(Continued)

(56) References Cited

U.S. PATENT DOCUMENTS 6,359,331 B1    3/2002 Rinehart et al.
6,642,576 B1 *  11/2003 Shirasawa ............. H01L 25/071
                                                           257/288
(Continued)

FOREIGN PATENT DOCUMENTS

WO    2014166692 A1    10/2014

OTHER PUBLICATIONS

Hiroaki Ichikawa, et al., IGBT Modules for Hybrid Vehicle Motor Driving, vol. 55 No. 2 Fuji Electric Review, pp. 46-50.

*Primary Examiner* — Scott B Geyer
(74) *Attorney, Agent, or Firm* — David B. Kelley; MacMillan, Sobanski & Todd, LLC

(57) ABSTRACT

A power module provides one or more power transistors and support elements in a card shape. The pins/terminals for signal-level input/outputs (e.g., gate drive, current sensor, and temperature sensor signals) are arranged in two parallel layers. The power terminals (e.g., positive and negative bus, and output junction of a phase leg) are preferably arranged in just one of the layers. The signal pins are spaced both laterally across a long edge of the power module and transversely to the edge direction, so that the minimum spacings (i.e., clearances) can be achieved while shortening the lateral length of the edge(s) of the power module. Preferably, the signal pins belonging to an individual power transistor (e.g., an IGBT or MOSFET) are distributed between the two layers so that corresponding signal loops can be magnetically decoupled from the power terminal loop.

19 Claims, 5 Drawing Sheets

(51) Int. Cl.
- *H05K 1/14* (2006.01)
- *H05K 1/18* (2006.01)
- *H02M 7/00* (2006.01)
- *H05K 1/02* (2006.01)
- *H05K 1/03* (2006.01)
- *H05K 3/40* (2006.01)

(52) U.S. Cl.
CPC ......... *H05K 1/0265* (2013.01); *H05K 1/0306* (2013.01); *H05K 1/142* (2013.01); *H05K 1/145* (2013.01); *H05K 1/18* (2013.01); *H01L 2224/48091* (2013.01); *H01L 2224/48247* (2013.01); *H01L 2924/181* (2013.01); *H05K 3/4015* (2013.01); *H05K 2201/0397* (2013.01); *H05K 2201/10272* (2013.01)

(58) Field of Classification Search
CPC .................. H01L 29/083–29/0834; H01L 23/28–23/3192; H01L 21/56–21/568; H01L 2924/181; H05K 1/0265; H05K 1/0306; H05K 1/142; H05K 1/145; H05K 1/18; H05K 3/4015; H05K 2201/0397; H05K 2201/10272; H02M 7/003; H02M 7/515; H02M 7/521; H02M 7/537; H02M 7/5387; H02M 7/5381

See application file for complete search history.

(56) References Cited

U.S. PATENT DOCUMENTS

| | | | |
|---|---|---|---|
| 6,771,507 | B1 | 8/2004 | Belady et al. |
| 7,289,328 | B2 | 10/2007 | Belady et al. |
| 7,405,107 | B2* | 7/2008 | Nakazawa ............ H01L 21/565 257/796 |
| 7,705,443 | B2 | 4/2010 | Yokomae et al. |
| 8,274,791 | B2* | 9/2012 | Kanzaki ................. B60R 25/00 165/104.33 |
| 8,436,429 | B2 | 5/2013 | Xue et al. |
| 8,482,904 | B2 | 7/2013 | Darroman et al. |
| 8,531,840 | B2* | 9/2013 | Tachibana ............ H05K 7/1432 361/688 |
| 8,907,477 | B2 | 12/2014 | Yamada et al. |
| 9,024,423 | B2 | 5/2015 | Muto et al. |
| 9,041,183 | B2* | 5/2015 | Liang .................... H01L 25/072 257/691 |
| 2007/0267739 | A1* | 11/2007 | Kajiwara ................ H01L 23/16 257/707 |
| 2008/0054425 | A1* | 3/2008 | Malhan ................... H01L 24/72 257/678 |
| 2009/0078456 | A1* | 3/2009 | Macropoulos ......... H05K 1/024 174/261 |
| 2009/0194862 | A1* | 8/2009 | Kitami ............... H01L 23/3185 257/690 |
| 2009/0302444 | A1* | 12/2009 | Ueda ..................... H01L 21/565 257/675 |
| 2013/0015495 | A1* | 1/2013 | Hauenstein ........... H01L 25/071 257/140 |
| 2016/0126157 | A1* | 5/2016 | Jeon .................... H01L 23/4334 257/693 |

\* cited by examiner

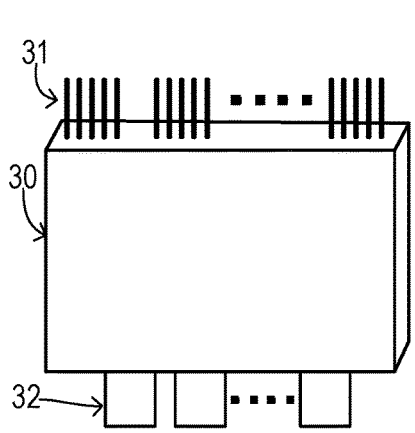
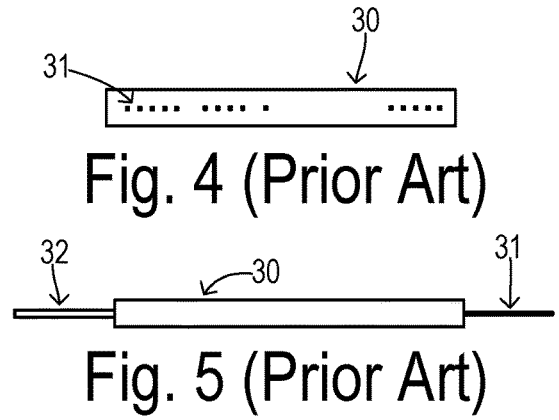
Fig. 4 (Prior Art)
Fig. 5 (Prior Art)
Fig. 3 (Prior Art)
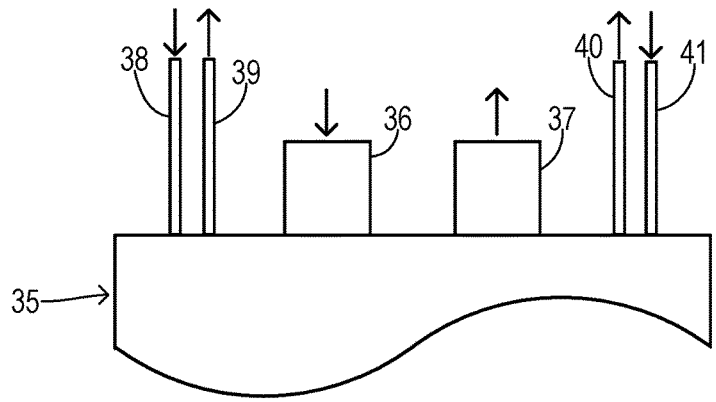
Fig. 6 (Prior Art)
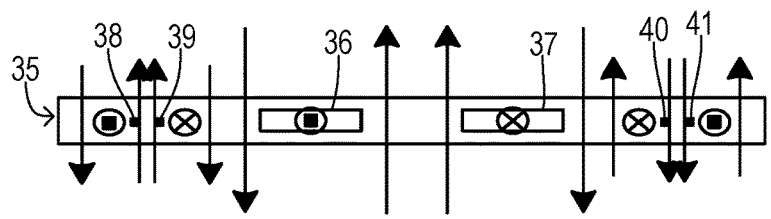
Fig. 7 (Prior Art)

US 10,137,789 B2

SIGNAL PIN ARRANGEMENT FOR MULTI-DEVICE POWER MODULE

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to power modules containing high-power transistors for use in inverters for electric vehicles, and, more specifically, to substrate and connector pin configurations to improve space utilization and reduce signal interactions.

Electric vehicles, such as hybrid electric vehicles (HEVs), plug-in hybrid electric vehicles (PHEVs), and battery electric vehicles (BEVs), use inverter-driven electric machines to provide traction torque. A typical electric drive system may include a DC power source (such as a battery pack or a fuel cell) coupled by contactor switches to a variable voltage converter (VVC) to regulate a main bus voltage across a main DC linking capacitor. An inverter is connected between the main buses and a traction motor in order to convert the DC bus power to an AC voltage that is coupled to the windings of the motor to propel the vehicle.

The inverter includes transistor switching devices (such as insulated gate bipolar transistors, or IGBTs) connected in a bridge configuration with a plurality of phase legs. A typical configuration includes a three-phase motor driven by an inverter with three phase legs. An electronic controller turns the switches on and off in order to invert a DC voltage from the bus to an AC voltage applied to the motor. The inverter may pulse-width modulate the DC link voltage in order to deliver an approximation of a sinusoidal current output to drive the motor at a desired speed and torque. Pulse Width Modulation (PWM) control signals applied to the gates of the IGBTs turn them on and off as necessary so that the resulting current matches a desired current.

Because of the relatively high power (e.g., 100 kW) being handled by the inverter switching transistors, they are typically constructed as power modules which plug into sockets on a main circuit board containing a motor controller IC and other support circuits. Heat removal structures, such as a liquid-cooled cold plate, are typically disposed in contact with the power module(s) to handle the large amounts of heat that are generated. A typical module may include a DCB (direct copper bonded) substrate with one or more power transistor chips soldered onto a copper layer, a lead frame with multiple input/output pins, and an overmolded body encapsulating the module.

A power module may include just one switching element (e.g., an IGBT together with a freewheeling diode, a reverse-conducting or RC-IGBT, or a SiC MOSFET), which is referred to as a 1-in-1 power card. A power card may be single-side cooled or double-side cooled. A power module may also have a plurality of switching transistors, i.e., an N-in-1 power card. A 2-in-1 power card can be used to form a single phase leg of an inverter bridge. Power modules are also available with 4 or more switching transistors internally connected in a configuration that provides a plurality of phase legs, and may sometimes include redundant transistors connected in parallel when forming a phase leg.

The power module may typically have the shape of a flat, thin plate. Connector pins extending from the module include power terminals for the inputs and output(s) of the phase leg(s) and signal pins for the transistor control signals (i.e., gate signals) and various sensor signals. For example, many power modules have been provided with on-chip temperature sensors and/or current sensors.

In one type of conventional design, the power terminals and signal pins extend from one or more of the narrow sides or edges of the module. The terminals/pins can remain straight so that when plugged into a socket on a main circuit board, the module is oriented transverse to the main circuit board and both of the largest sides of the module are exposed for heat removal by a heat sink or cold plate. The terminals/pins can also be bent so that the module lays flat on the main circuit board. In any event, the relatively high voltage levels that may be present between different terminals/pins dictate a minimum spacing between adjacent terminals/pins. As the number of devices and the associated sensors increases, more terminals/pins are needed for the module and the required length of the sides of the module where the terminals/pins are arranged also increases. Consequently, the footprint on the main circuit board may be undesirably increased. This problem is especially significant when using a DCB substrate because the simplest and least expensive manner for forming the terminals/pins is for them to extend outward along the plane defined by the DCB substrate, which results in the terminals/pins all occupying a single layer.

The necessary chip size for any particular power capability has been shrinking as a result of developments in the field of power semiconductors which have achieved lower losses, higher current densities (e.g., SiC power devices), and reverse conducting capability (e.g., RCIGBT). However, arrangement of the signal pins in a single layer might limit the potential use of reduced chip size and further reductions of power card size, especially for N-in-1 power cards with N greater than 2.

Another consequence of having the signal pins arranged in one layer is that the power terminals are on the same layer with the signal pins. Therefore, the signal pins have been spaced from the power terminals so that the magnetic field generated by power terminals will not couple to the signal loops (i.e., so that there is no constructive or destructive interference with the signals being conducted on the signal pins). Thus, single layer modules employ pin spacing that avoids coupling from a power loop to a signal loop which could otherwise induce a gate current that inadvertently turns on one of the power devices, slows down the switching speed of the power devices, and/or interferes with the on-die sensors' signals. However, it would be advantageous to reduce the spacing without causing such coupling.

SUMMARY OF THE INVENTION

In one aspect of the invention, a power module has a first insulating substrate with a bonded copper layer on a first side defining circuit traces, a plurality of first signal pins, and a plurality of power terminals. The first signal pins and power terminal are coplanar and each cantilevers beyond an edge of the first substrate. At least one semiconductor chip containing a power transistor has a side soldered to a respective circuit trace on the first substrate that extends to one of the power terminals. A second insulating substrate is provided parallel to the first substrate and having a bonded copper layer on an interior side facing the first side and defining circuit traces and a plurality of second signal pins. The second signal pins are coplanar and each cantilevers beyond an edge of the second substrate. The chip includes a plurality of signal pads, wherein a first group of the signal pads are each connected to a respective first signal pin, and wherein a second group of the signal pads are each connected to a respective second signal pin. A plurality of spacers are each soldered between the first side and the interior side. An encapsulating body secures the substrates, chip, and spacers, wherein the signal pins and power terminals extend through the encapsulating body.

BRIEF DESCRIPTION OF THE DRAWINGS

FIGS. 3, 4, and 5 are isometric, end, and side views, respectively, of a prior art power module with a single pin layer having signal pins and power terminals on opposite sides.

FIG. 6 is a plan view at one side of a power module with both signal pins and power terminals.

FIG. 7 is an end view of the power module of FIG. 6 showing induced magnetic fields for the signal pins and power terminals.

DETAILED DESCRIPTION OF PREFERRED EMBODIMENTS

The present invention arranges the pins/terminals for the signal-level input/outputs (e.g., gate drive, current sensor, and temperature sensor signals) in two parallel layers in the power module. The power terminals (e.g., positive and negative bus, and/or an output junction of a phase leg) are preferably arranged in just one of the layers. The signal pins are spaced both laterally across a long edge of the power module and transversely to the edge direction, so that the minimum spacings (i.e., clearances) can be achieved while shortening the lateral length of the edge(s) of the power module. Preferably, the signal pins belonging to an individual power transistor (e.g., IGBT or MOSFET) are distributed between the two layers so that corresponding signal loops can be magnetically decoupled from the power terminal loop.

Figure 1:
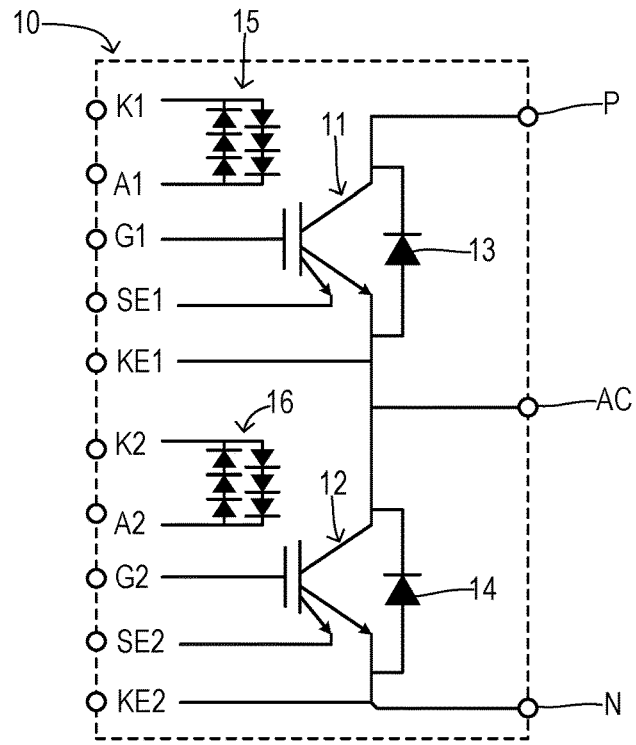
FIG. 1 is a schematic diagram showing a typical 2-in-1 power module.

Referring to FIG. 1, an example configuration for a power module 10 has first and second power transistors 11 and 12 with reverse diodes 13 and 14, respectively. Transistors 11 and 12 are connected in series between a positive bus terminal P and a negative bus terminal N. A junction between transistors 11 and 12 is connected to a power terminal AC for providing a phase leg output when using power module 10 for a phase leg in an inverter bridge. Power transistors 11 and 12 have respective gate input terminals G1 and G2 and respective Kelvin emitter terminals KE1 and KE2, each pair of gate/emitter terminals receiving a respective gate drive signal to turn power transistors 11 and 12 on and off according to a switching algorithm implemented in a controller (not shown).

Transistors 11 and 12 have respective current sensor outputs SE1 and SE2 for providing a signal proportional to the main current flowing through transistors 11 and 12. On-die temperature sensors 15 and 16 are provided in close proximity to transistors 11 and 12, respectively, for providing associated temperature signals across terminals K1 and A1, and K2 and A2, respectively.

Figure 2:
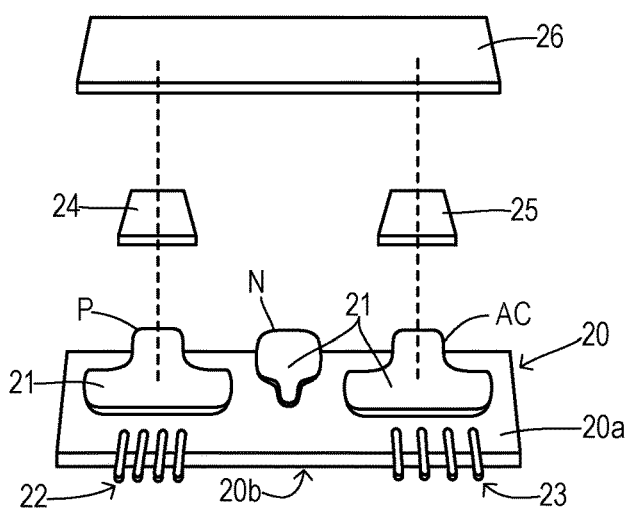
FIG. 2 is an exploded view showing portions of a prior art power module.

A typical construction for a power module as shown in FIG. 2 may include a direct copper bond (DCB) substrate 20, wherein a first side 20a has a bonded copper layer that has been etched to define circuit traces 21 and signal pins 22 and 23. A second bonded copper layer on the opposite side 20b of substrate 20 may function as a heat spreader for removing heat generated during switching of power transistors 11 and 12 as known in the art. Traces 21 also extend from a respective edge of substrate 20 to form power terminals P, N, and AC. Signal pins 22 and 23 and power terminals P, N, and AC are coplanar and each cantilevers beyond a respective edge of substrate 20. Signal pins 22 and 23 and power terminals P, N, and AC may be formed by etching of a bonded copper layer or may be formed using a lead frame, for example.

Semiconductor chips 24 and 25 each provides a respective power transistor, reverse diodes, and on-chip sensors (e.g., a current sensor and a temperature sensor). Each chip includes a plurality of input/output pads for connecting to external circuitry via direct soldering or by jumper wires soldered between the pads and the circuit traces or pins. Typically, one side of the semiconductor chip forms a collector terminal which is directly soldered to traces 21, whereby terminal pins P and N are directly connected via the traces to the transistor emitters. The emitter sides of the transistors are connected by jumper wires to respective circuit traces or terminals. A heat spreader 26 comprised of a conductive plate is disposed against the remaining sides of chips 24 and 25 for carrying away thermal energy to a heat sink such as a cold plate. The heat spreader can be a DCB board or just a copper layer without insulation. The power module is typically held together by encapsulating the component shown in FIG. 2 within an overmolded body (e.g., thermoplastic).

FIGS. 3-5 show a power module 30 of a type used for electric vehicle converters. An arbitrary number of power transistors can be built into a power module, typically in multiples of two according to a desired number of phase legs per module. Each IGBT or MOSFET transistor typically has five signal pins comprised of gate and Kelvin emitter pins (for receiving a gate drive signal) and sensor pins including a current sensor pin and temperature anode and cathode pins. In the embodiment shown in FIGS. 3-5, signal pins 31 extend from one edge of module 30 and power terminals 32 extend from an opposite edge, wherein pins 31 and terminals 32 are all coplanar in a single layer. The number of power terminals typically includes positive and negative bus terminals and a junction terminal for each phase leg. As the number of power transistors increases, the necessary length of the side where signal pins 31 extend also proportionally increases. Pin spacing requirements can be significant in order to maintain sufficient voltage clearance between adjacent pens because there may be a voltage difference of about 15 to 20 V between pins of the same transistor device and a voltage difference of a few hundred volts between pins belonging to different transistor devices. Consequently, the device shown in FIGS. 3-5 can become too long for some applications.

FIG. 6 shows another prior art power module 35 having power terminals 36 and 37 for conducting current in the direction shown. A pair of signal pins 38 and 39 and a pair of signal pins 40 and 41 likewise conduct current in the directions shown. Terminals 36 and 37 and pins 38-41 are shown extending from a common edge of power module 35, but the magnetic interaction discussed herein is equally valid for the case where the terminals and pins occupy a single layer but extend from opposite edges. As shown in FIG. 7, power terminals 36 and 37 induce magnetic fields that are perpendicular to the plane defined by flat module 35 (i.e., perpendicular to the line formed by the single layer of pins and terminals). Likewise, signal pins 38-41 has an orientation that induces perpendicular magnetic fields. Likewise, currents are induced in signal pins 38-41 by magnetic fields that are transverse to the pin layer (e.g., generated by currents in power terminals 36 and 37). Since the magnetic field directions associated with pins 38-41 are either parallel or anti-parallel with respect to the field directions for power terminals 36 and 37, magnetic coupling between the power loops and signal loops may be sufficiently great to cause interference with the gate and sensor signals.

Figure 8:
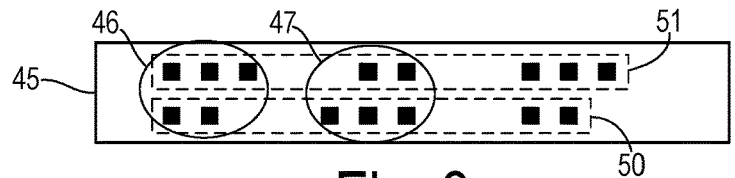
FIGS. 8 and 9 are end and side views, respectively, of a power module of the present invention.
Figure 9:
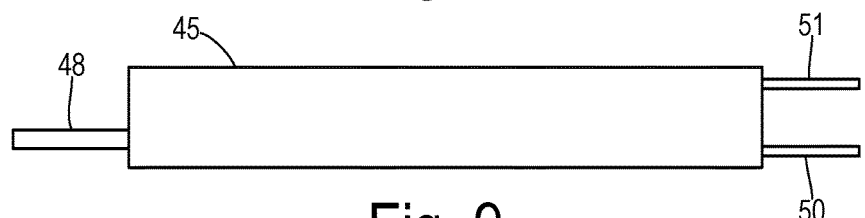

FIGS. 8 and 9 show a power module 45 of the present invention wherein signal pins are arranged in multiple layers in order to reduce a footprint length of the module. Signal pins extending from one edge of module 45 include pins 46 and pins 47, each representing a group of 5 pins for a respective power transistor. The signal pins are distributed between a first layer 50 and a second layer 51. Layer 51 is preferably coplanar with power terminals 48. By distributing signal pins between layers 50 and 51, a more compact power module is obtained. In addition, specific interconnection of matched pairs of signal pins so that interacting pins are distributed between the two layers will be described below which results in magnetically decoupling the signal loops from the power loops.

Figure 10:
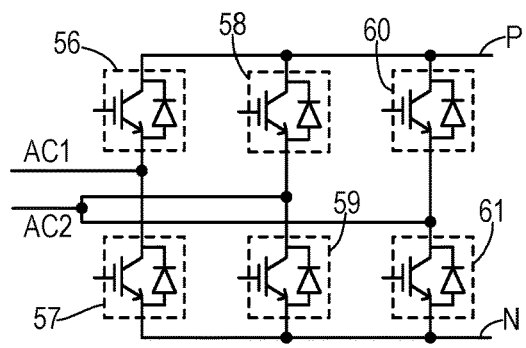
FIG. 10 is a schematic diagram showing an arrangement of power devices according to one embodiment of a power module.
Figure 11:
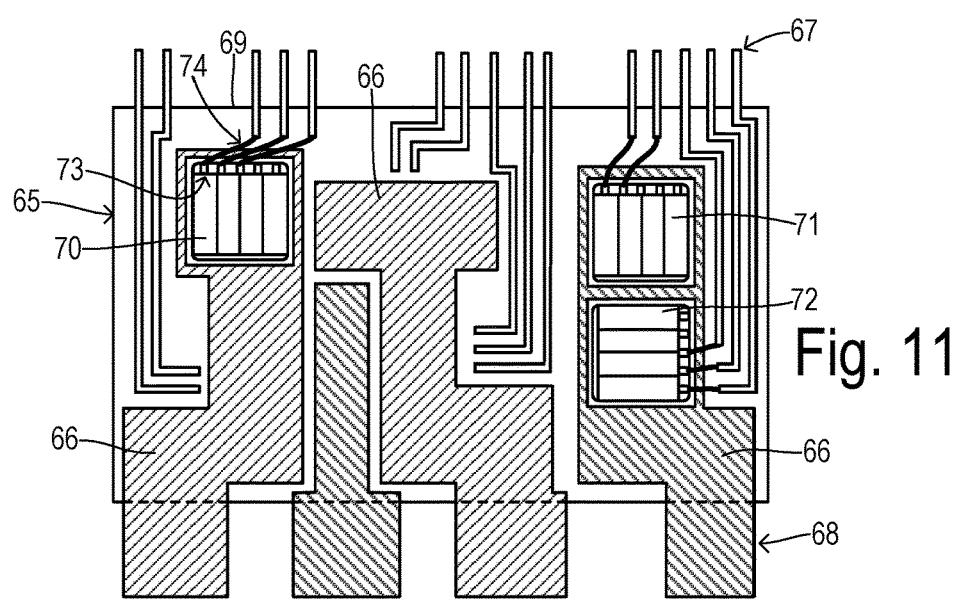
FIG. 11 is a plan view showing a first DCB substrate with power terminals, signal pins, and circuit traces receiving some of the semiconductor chips for the circuit of FIG. 10.
Figure 12:
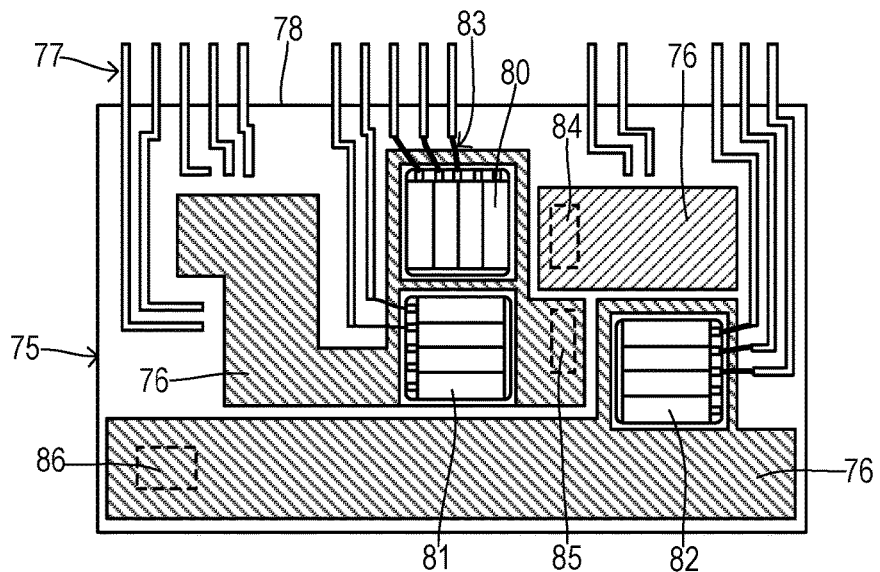
FIG. 12 is a plan view showing a second DCB substrate with signal pins and circuit traces receiving others of the semiconductor chips for the circuit of FIG. 10.
Figure 13:
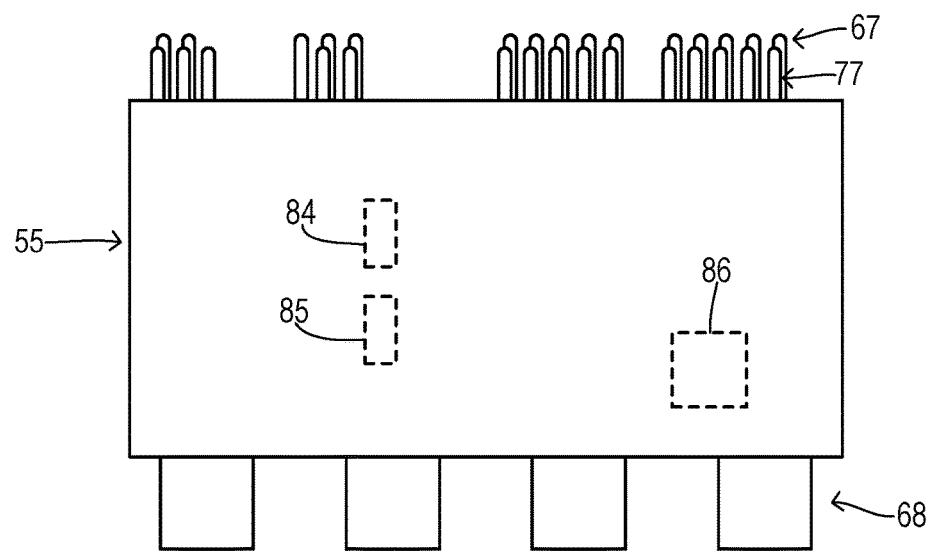
FIG. 13 is a plan view showing the first and second substrates of FIGS. 11 and 12 mated together to form a power module with signal pins arranged in two layers.

An overall layout for one detailed embodiment of a power module 55 is shown in FIGS. 11-13. FIG. 10 is a schematic representation showing the arrangement of power transistors and a circuit configuration of module 55 for forming a pair of phase legs. Transistor devices 56 and 57 are connected in series to form a first phase leg that has an output AC1 at an intermediate junction. A second phase leg has an output AC2 by connecting in parallel the intermediate junctions of a pair of series-connected power transistors 58 and 59 and power transistors 60 and 61. The parallel combination of two sets of transistors into one phase leg serves to increase current-carrying capacity.

The present embodiment employs a first insulating substrate shown in FIG. 11 and a second insulating substrate shown in FIG. 12, which are united to form a module as shown in FIG. 13.

Referring to FIG. 11, a first DCB substrate 65 has a first side defining circuit traces 66, a plurality of first signal pins 67, and a plurality of power terminals 68. First signal pins 67 are coplanar with power terminals 68 and circuit traces 66. Pins 67 each cantilever beyond an edge 69 of substrate 65. Power terminals 68 cantilever beyond an opposite edge of DCB substrate 65. A plurality of semiconductor chips 70, 71, and 72 (each containing a respective power transistor) has a respective emitter side soldered to respective circuit traces 66, thereby connecting the collector to power terminals 68 according to the configuration shown in FIG. 10.

Each semiconductor chip 70-72 has a plurality of signal pads, including pads 73 shown for chip 70. Certain ones of signal pads 73 are connected to respective ones of signal pins 67 using soldered jumper wires 74, so that a subset (i.e., less than all) of the signal pins associated with chip 70 are assigned to the first layer of signal pins 67.

A second DCB substrate 75 has a first (internal) side defining circuit traces 76 and a plurality of second signal pins 77. Preferably, no power terminals are provided on second substrate 75, but distributing the power terminals is also within the scope of the invention. Second signal pins 77 are coplanar with circuit traces 66, and each cantilevers beyond an edge 78 of substrate 75. A plurality of semiconductor chips 80, 81, and 82 (each containing a respective power transistor) has a respective emitter side soldered to respective circuit traces 76. In order to connect traces 76 to power terminals 68 on first substrate 65, conductive spacers are soldered between traces 76 and traces 66 (FIG. 11) after substrates 65 and 75 are brought together for fabricating the power module. The locations for soldering of the conductive spacers are shown at 84, 85, and 86.

Each semiconductor chip 80-82 has a plurality of signal pads. For each respective chip, some of its signal pads are connected to respective ones of second signal pins 77 using soldered jumper wires (e.g., wires 83). For chips 70-72 and 80-82, the signal pads that are not jumpered to signal pins on the same substrate are jumpered to signal pins on the other substrate. Thus, the signal pins associated with each particular chip are distributed between first layer of signal pins 67 and second layer of signal pins 77. FIG. 13 shows the unified substrates placed side-by-side so that the signal pin layers are in spaced, parallel planes. In this position, jumper wires and the conductive spacers can be soldered between the two substrates.

Figure 14:
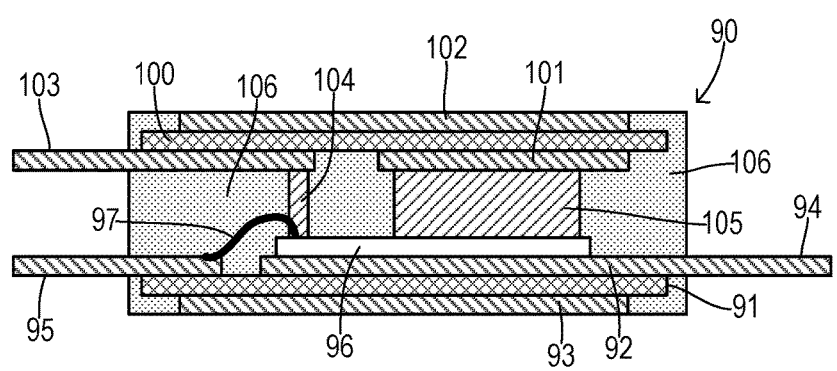
FIG. 14 is a cross section showing a two layer construction according to the present invention.

The structure of a power module 90 is shown in greater detail in the cross-sectional view of FIG. 14. A first DCB substrate includes an insulating layer 91 with a shaped (e.g., etched) bonded copper layer 92 on one (internal) surface and a continuous bonded copper layer 93 on the other (external) side surface. Copper layer 92 extends beyond one edge of insulating layer 91 to form a power terminal 94 and beyond an opposite edge to form a signal pin 95. A semiconductor chip 96 is soldered to copper layer 92 and has a signal pad connected by a jumper wire 97 to signal pin 95. A second insulating layer 100 has a shaped bonded copper layer 101 on one side and a continuous copper bonded copper layer 102 on the other side. A signal pin 103 extends along a common edge with signal pin 95 as part of a second, parallel layer. Conductive spacers 104 and 105 are soldered between semiconductor chip 96 and copper layer 101 to provide both necessary electrical connections and a controlled spacing to enable the penetration of an overmolding or encapsulating material 106 in order to provide a main structural body for power module 90. Conductive spacers may also be soldered between the interior copper layers of the two substrates. The outer, continuous copper layers function as heat spreaders to efficiently withdraw heat from module 90 during operation.

Figure 15:
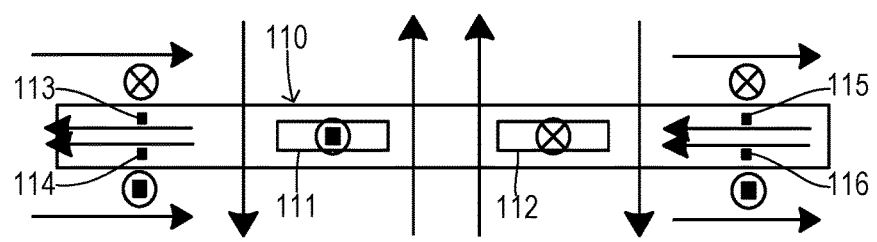
FIG. 15 is an end view of a power module of the invention showing magnetic fields associated with the power terminals and signal pins.

The problem of magnetic coupling and interference between a power loop and a signal loop is addressed by the present invention as shown in FIG. 15. A power module 110 has power terminals 111 and 112 spaced longitudinally along a longitudinal edge of module 110. A pair of signal pins 113 and 114 and a pair of signal pins 115 and 116 are each transversely aligned with respect to the substrate edge (i.e., each pair of pins is spaced along a line that is perpendicular to a line defined by the spacing of power terminals 111 and 112.). Each pair of signal pins 113/114 and 115/116 is selected to match a respective signal loop, such as a gate signal loop comprised of the gate pin and the Kelvin emitter pin of one power transistor, or a sensor signal loop such as the cathode and anode pins for a temperature sensor located at one power transistor. The resulting directions of the magnetic fields for the switched current in the power loop and the lower-level signals in the signal loops are likewise oriented transversely, meaning that there is no net coupling and interference is avoided.

The matching of signals pins according to FIG. 15 preferably corresponds to the matching up of the signal pads for one power transistor that receive a gate drive signal for that power transistor. Thus, the signal pads for one chip are split into a first group of signal pads which includes one of the pair of gate drive signal pads and a second group of signal pads which includes the other of the pair of gate drive signal pads, and the first group of signal pads are connected to pins in the first layer of pins and the second group of signal pads are connected to pins in the second layer of pins. Preferably, first and second signal pins that are connected to the pair of gate drive signal pads are transversely aligned with respect to the edge of the module.

In each semiconductor chip, there may be a pair of signal pads adapted to provide a chip temperature signal. The first group of pads that are connected to the first layer of signal pins may include one of the pair of temperature signal pads, and the second group of pads that are connected to the second layer of signal pins may include the other of the pair of temperature signal pads. Again, the first and second signal pins that are connected to the pair of temperature signal pads are preferably transversely aligned with respect to the edge of the module.

The foregoing has described a two-layer signal pin design for a power module with significant advantages. For an N-in-1 power module, the two-layer signal pin design can save space while maintaining sufficient voltage clearances, so that the overall power module size can be reduced. On a main gate-drive board for an inverter system controller (ISC), it take several power modules mounted together on the board in order to drive a plurality of phase legs. The signal pin layout of this invention can concentrate the footprint needed to receive the power modules on the gate drive board. Consequently, the gate drive board size can be reduced and the signal trace layout on the gate-drive board can be simplified. The two-layer signal pin design can dramatically reduce magnetic coupling between power loops and signal loops (e.g., during device switching transients), especially when the power terminals are arranged close to the signal pins. The power terminal layout has more flexibility when designing a power module because the invention alleviates the need to keep power terminals as far away as possible from the signal pins.

What is claimed is:

1. A power module comprising:
a first insulating substrate having a bonded copper layer on a first side defining circuit traces, a plurality of first signal pins, and a plurality of power terminals, wherein the first signal pins and power terminal are coplanar and each cantilevers beyond an edge of the first substrate;
at least one semiconductor chip containing a power transistor and having a side soldered to a respective circuit trace on the first substrate that extends to one of the power terminals;
a second insulating substrate parallel to the first substrate and having a bonded copper layer on an interior side facing the first side and defining circuit traces and a plurality of second signal pins, wherein the second signal pins are coplanar and each cantilevers beyond an edge of the second substrate, wherein the chip includes a plurality of signal pads, wherein a first group of the signal pads are each connected to a respective first signal pin, and wherein a second group of the signal pads are each connected to a respective second signal pin;
a plurality of spacers each soldered between the first side and the interior side; and
an encapsulating body securing the substrates, chip, and spacers, wherein the signal pins and power terminals extend through the encapsulating body.

2. The module of claim 1 comprising a plurality of semiconductor chips soldered to respective circuit traces on the first and second substrates, wherein each chip contains a respective power transistor, and wherein power terminals for all the power transistors all extend from the first substrate.

3. The module of claim 1 wherein a pair of the signal pads are adapted to receive a gate drive signal for the power transistor, wherein the first group includes one of the pair of gate drive signal pads and the second group includes the other of the pair of gate drive signal pads.

4. The module of claim 3 wherein respective first and second signal pins connected to the pair of gate drive signal pads are transversely aligned with respect to the edge of the first substrate, whereby a magnetic field associated with a gate current in the first and second signal pins is oriented transverse to a magnetic field associated with a switched current in the power terminals.

5. The module of claim 1 wherein a pair of the signal pads are adapted to provide a chip temperature signal, wherein the first group includes one of the pair of temperature signal pads and the second group includes the other of the pair of temperature signal pads.

6. The module of claim 5 wherein respective first and second signal pins connected to the pair of temperature signal pads are transversely aligned with respect to the edge of the first substrate, whereby a magnetic field associated with a temperature signal in the first and second signal pins is oriented transverse to a magnetic field associated with a switched current in the power terminals.

7. The module of claim 1 wherein the first signal pins and the power terminals extend from opposite edges of the first substrate.

8. The module of claim 7 wherein the first and second signal pins extend from proximate edges of the first and second substrates, respectively.

9. The module of claim 1 wherein the first and second substrates each has an exterior side comprised of a bonder copper layer adapted to transfer heat generated in the power transistor.

10. A power module comprising:
a pair of spaced apart substrates having circuit traces connecting a plurality of signal pins and power terminals respectively thereon and coplanarly cantilevered beyond edges of the substrates;

at least one semiconductor chip attached to a circuit trace on one of the substrates;

a plurality of spacers between the substrates; and an encapsulating body;

wherein spacing of paired signal pins and spacing of paired power terminals are transverse for magnetic decoupling.

11. The power module of claim 10 wherein the signal pins and power pins extend through the encapsulating body.

12. A phase leg for an inverter in an electric vehicle, comprising:

a first insulating substrate having a bonded copper layer on a first side defining circuit traces, a plurality of first signal pins, and a plurality of power terminals, wherein the first signal pins and power terminal are coplanar and each cantilevers beyond an edge of the first substrate;

a plurality of semiconductor chips each containing a respective power transistor and having a respective side soldered to a respective circuit trace on the first substrate that extends to one of the power terminals;

a second insulating substrate parallel to the first substrate and having a bonded copper layer on an interior side facing the first side and defining circuit traces and a plurality of second signal pins, wherein the second signal pins are coplanar and each cantilevers beyond an edge of the second substrate, wherein the circuit traces connect respective power transistors in series with an intermediate junction providing a phase leg output, wherein each chip includes a plurality of signal pads, wherein a first group of the signal pads of each power transistor are each connected to a respective first signal pin, and wherein a second group of the signal pads of each power transistor are each connected to a respective second signal pin;

a plurality of spacers each soldered between the first side and the interior side; and an encapsulating body securing the substrates, chips, and spacers, wherein the signal pins and power terminals extend through the encapsulating body.

13. The phase leg of claim 12 wherein a pair of the signal pads of each power transistor are adapted to receive a respective gate drive signal, and wherein each first group includes one of the pair of the respective gate drive signal pads and each second group includes the other of the pair of the respective gate drive signal pads.

14. The phase leg of claim 13 wherein respective first and second signal pins connected to each pair of gate drive signal pads are transversely aligned with respect to the edge of the first substrate, whereby a magnetic field associated with a gate current in the respective first and second signal pins is oriented transverse to a magnetic field associated with a switched current in the power terminals.

15. The phase leg of claim 12 wherein a pair of the signal pads of each chip are adapted to provide a chip temperature signal, wherein each first group includes one of the respective pair of temperature signal pads and each second group includes the other of the respective pair of temperature signal pads.

16. The phase leg of claim 15 wherein respective first and second signal pins connected to the respective pair of temperature signal pads are transversely aligned with respect to the edge of the first substrate, whereby a magnetic field associated with a respective temperature signal in the first and second signal pins is oriented transverse to a magnetic field associated with a switched current in the power terminals.

17. The phase leg of claim 12 wherein the first signal pins and the power terminals extend from opposite edges of the first substrate.

18. The phase leg of claim 17 wherein the first and second signal pins extend from proximate edges of the first and second substrates, respectively.

19. The phase leg of claim 12 wherein the first and second substrates each has an exterior side comprised of a bonder copper layer adapted to transfer heat generated in the power transistors.

* * * * *